United States Patent
Chen

(10) Patent No.: US 7,929,328 B2
(45) Date of Patent: Apr. 19, 2011

(54) MEMORY AND STORAGE DEVICE UTILIZING THE SAME

(75) Inventor: Jui-Lung Chen, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 71 days.

(21) Appl. No.: 12/484,088

(22) Filed: Jun. 12, 2009

(65) Prior Publication Data

US 2010/0315852 A1     Dec. 16, 2010

(51) Int. Cl.
    *G11C 11/40*     (2006.01)
(52) U.S. Cl. ................. 365/51; 365/63; 365/72
(58) Field of Classification Search .......... 365/104, 365/177, 225.6
    See application file for complete search history.

(56) References Cited

U.S. PATENT DOCUMENTS

| 4,025,907 | A | * | 5/1977 | Karp et al. | 365/205 |
|---|---|---|---|---|---|
| 4,503,518 | A | * | 3/1985 | Iwahashi | 365/104 |
| 5,136,543 | A | * | 8/1992 | Matsuda et al. | 365/190 |
| 5,280,443 | A | * | 1/1994 | Hidaka et al. | 365/63 |
| 5,420,818 | A | * | 5/1995 | Svejda et al. | 365/104 |
| 5,495,440 | A | * | 2/1996 | Asakura | 365/149 |
| 5,499,205 | A | * | 3/1996 | Ahn et al. | 365/63 |
| 6,717,839 | B1 | * | 4/2004 | Du | 365/145 |
| 6,912,149 | B2 | * | 6/2005 | Yamaoka et al. | 365/145 |

* cited by examiner

*Primary Examiner* — Tan T. Nguyen

(57) ABSTRACT

A storage device including a memory and a reading circuit is disclosed. The memory includes a plurality of word lines, a first bit line, a second bit line, a third bit line, and a plurality of cells. The word lines are sequentially disposed in parallel. The first, the second, and the third bit lines are sequentially disposed in parallel and vertical with the word lines. Each cell corresponds to one word line and one bit line. The word line, which corresponds to the cell corresponding to the first bit line, differs from the word line, which corresponds to the cell corresponding to the second bit line. The read circuit is coupled to the memory for reading the data stored in the memory.

11 Claims, 3 Drawing Sheets

US 7,929,328 B2

MEMORY AND STORAGE DEVICE UTILIZING THE SAME

BACKGROUND OF THE INVENTION

1. Field of the Invention

The invention relates to an arrangement structure of cells, and more particularly to an arrangement structure of cells of a storage device.

2. Description of the Related Art

FIG. 1 is a schematic diagram of a conventional arrangement for cells. When the word line WL is asserted, the transistors in the cells $C_0 \sim C_3$ are turned on. Thus, the bit lines $BL_0 \sim BL_3$ are capable of tramsmitting a corresponding level. Referring to FIG. 1, when the transistors in the cells $C_0 \sim C_3$ are turned on, the bit line $BL_1$ transmits a high level and the bit lines $BL_0$, $BL_2$, and $BL_3$ transmit a low level (e.g. VSS).

However, coupling capacitances exist between the bit line $BL_1$ and the neighboring bit line, such as $BL_0$ and $BL_2$. The bit line $BL_1$ may transmits an abnormal level (e.g. low level) due to the coupling capacitances. To solve the problem, the conventional method utilizes pull-up loads to connect the bit lines. However, costs are increased. Furthermore, unnecessary current paths are formed due to the extra pull-up loads. Thus, power consumption is increased.

BRIEF SUMMARY OF THE INVENTION

Storage devices are provided. An exemplary embodiment of a storage device comprises a memory and a reading circuit. The memory comprises a plurality of word lines, a first bit line, a second bit line, a third bit line, and a plurality of cells. The word lines are sequentially disposed in parallel. The first, the second, and the third bit lines are sequentially disposed in parallel and vertical with the word lines. Each cell corresponds to one word line and one bit line. The word line, which corresponds to the cell corresponding to the first bit line, differs from the word line, which corresponds to the cell corresponding to the second bit line. The read circuit is coupled to the memory for reading the data stored in the memory.

Memories are also provided. An exemplary embodiment of a memory comprises a plurality of word lines, a first bit line, a second bit line, a third bit line, and a plurality of cells. The word lines are sequentially disposed in parallel. The first, the second, and the third bit lines are sequentially disposed in parallel and vertical with the word lines. Each cell corresponds to one word line and one bit line. The word line, which corresponds to the cell corresponding to the first bit line, differs from the word line, which corresponds to the cell corresponding to the second bit line. The read circuit is coupled to the memory for reading the data stored in the memory.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
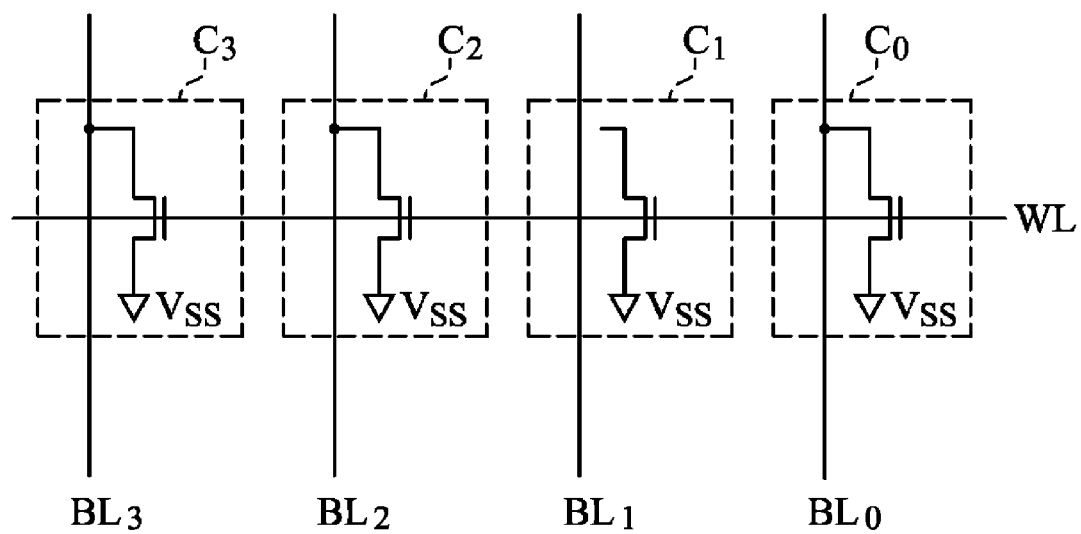
FIG. 1 is a schematic diagram of a conventional arrangement for cells.
Figure 2:
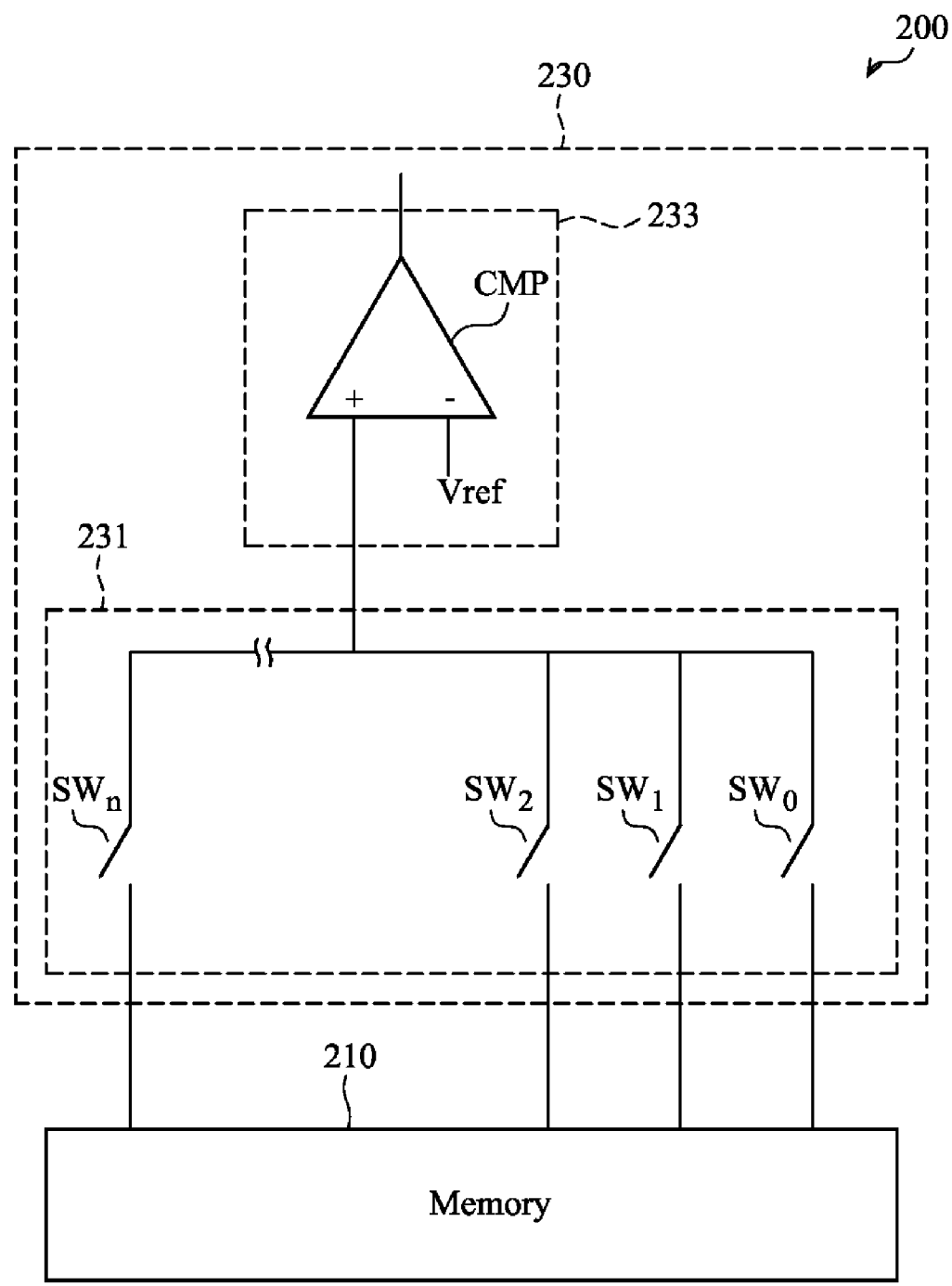
FIG. 2 is a schematic diagram of an exemplary embodiment of a storage device.

FIG. 2 is a schematic diagram of an exemplary embodiment of a storage device. The storage device 200 comprises a memory 210 and a reading circuit 230. The memory 210 comprises a large amount of cells (not shown). The reading circuit 230 reads the data stored in the cells of the memory 210. In one embodiment, the memory 210 is a read-only memory (ROM).

The reading circuit 230 comprises a switching unit 231 and a sensing unit 233. The switching unit 231 is coupled between the memory 210 and the sensing unit 233 to selectively output the data stored in the cells of the memory 210 to the sensing unit 233. In this embodiment, the switching unit 231 comprises switches $SW_0 \sim SW_n$. Each of the switches $SW_0 \sim SW_n$ is coupled to a corresponding bit line of the memory 210. Thus, the number of the switches $SW_0 \sim SW_n$ corresponds to the number of the bit lines of the memory 210.

When one of the switches $SW_0 \sim SW_n$ is turned on, the level on the corresponding bit line is transmitted to the sensing unit 233. A controller (not shown) determines whether to turn on the switches $SW_0 \sim SW_n$. Those skilled in the art can utilize numerous methods to achieve the controller, thus, description thereof is omitted. In addition, when one switch is turned on, the other switches are turned off.

The sensing unit 233 obtains the data stored in the cell of the memory 210. In this embodiment, the sensing unit 233 is a comparator CMP to determine the level on the corresponding bit line. As shown in FIG. 2, the comparator CMP comprises a non-inventing input receiving the output of the switching unit 231, and an inventing input receiving a reference signal Vref. The comparator CMP compares the output of the switching unit 231 and the reference signal Vref and obtains the level on the bit line according to the compared result.

Figure 3:
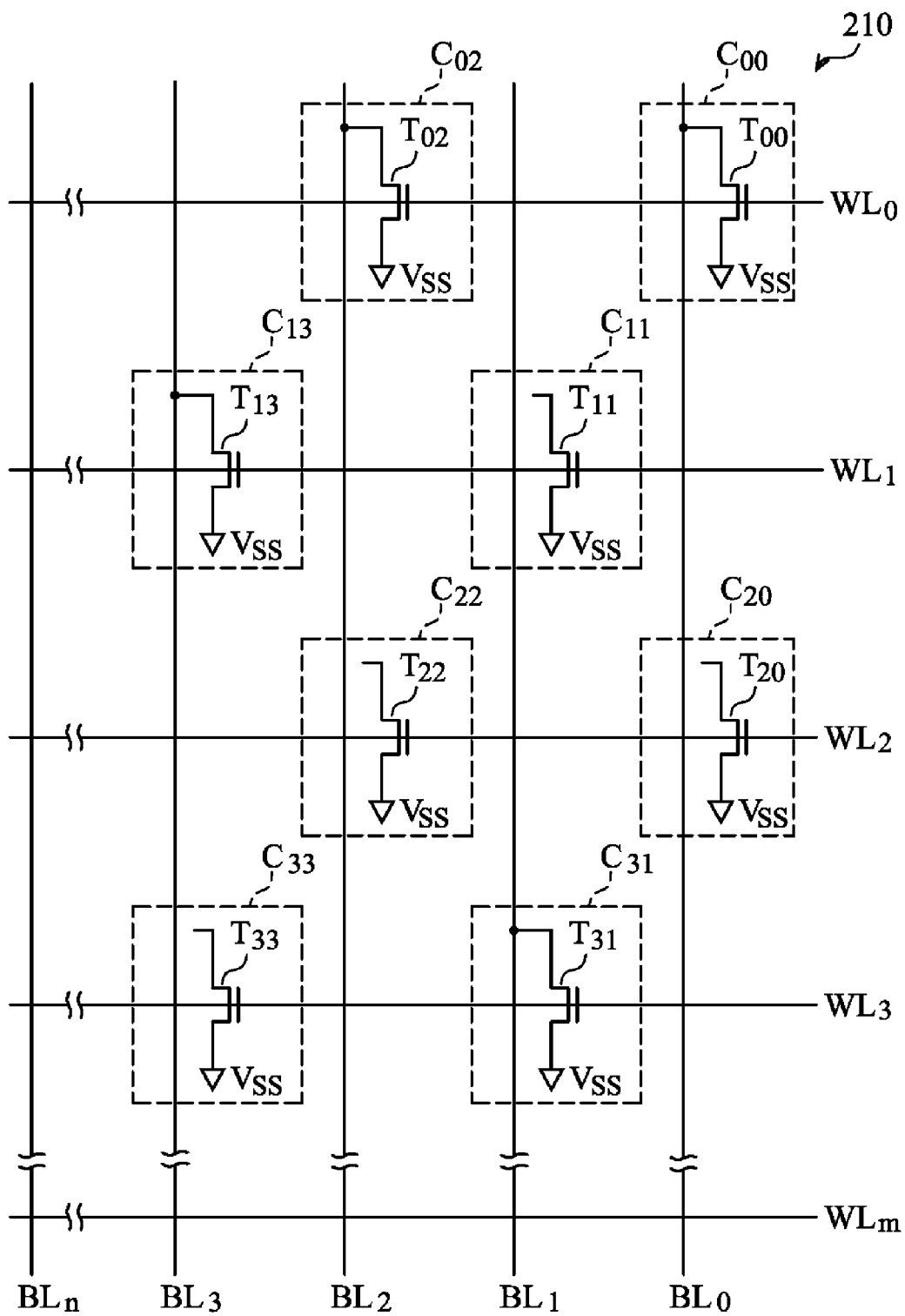
FIG. 3 is a schematic diagram of an exemplary embodiment of a memory.

FIG. 3 is a schematic diagram of an exemplary embodiment of a memory. The memory 210 comprises word lines $WL_0 \sim WL_m$, bit lines $BL_0 \sim BL_n$, and a plurality of cells. The word lines $WL_0 \sim WL_m$ are sequentially disposed in parallel. The bit lines $BL_0 \sim BL_n$ are vertical to the word lines $WL_0 \sim WL_m$ and are sequentially disposed in parallel. In this embodiment, the word lines $WL_0 \sim WL_m$ are extended to a horizontal direction.

Each cell corresponds to one word line and one bit line. For example, the cell $C_{00}$ corresponds to the word line $WL_0$ and the bit line $BL_0$. The cell $C_{11}$ corresponds to the word line $WL_1$ and the bit line $BL_1$. In this embodiment, the word line, which corresponds to the cell corresponding to the first bit line, differs from the word line, which corresponds to the cell corresponding to the second bit line. The first and the second bit lines are neighboring.

Taking the bit lines $BL_0 \sim BL_2$ as an example, the bit lines $BL_0 \sim BL_2$ are sequentially disposed in parallel. The word line (e.g. $WL_0$), which corresponds to the cell (e.g. $C_{00}$) corresponding to the bit line $BL_0$, differs from the word line (e.g. $WL_1$), which corresponds to the cell (e.g. $C_{11}$) corresponding to the bit line $BL_1$. The word line (e.g. $WL_2$), which corresponds to the cell (e.g. $C_{20}$) corresponding to the bit line $BL_0$, differs from the word line (e.g. $WL_3$), which corresponds to the cell (e.g. $C_{31}$) corresponding to the bit line $BL_1$.

Similarly, the word line (e.g. $WL_1$), which corresponds to the cell (e.g. $C_{11}$) corresponding to the bit line $BL_1$, differs from the word line (e.g. $WL_0$), which corresponds to the cell (e.g. $C_{02}$) corresponding to the bit line $BL_2$. The word line (e.g. $WL_3$), which corresponds to the cell (e.g. $C_{31}$) corresponding to the bit line $BL_1$, differs from the word line (e.g. $WL_2$), which corresponds to the cell (e.g. $C_{22}$) corresponding to the bit line $BL_2$.

Since the word line, which corresponds to the cell corresponding to the first bit line, differs from the word line, which corresponds to the cell corresponding to the second bit line neighbor on the first bit line, the level transmitted by the corresponding bit line is not affected by the coupling capacitances. For example, when the word line $WL_0$ is asserted and the word line $WL_1$ is un-asserted, since the bit lines $BL_1$ and $BL_3$ are not transmitting the corresponding level, the level on the bit lines $BL_0$ and $BL_2$ are not affected by the level on the neighboring bit lines (i.e. the bit lines $BL_1$ and $BL_3$).

Similarly, when the word line $WL_0$ is un-asserted and the word line $WL_1$ is asserted, since the bit lines $BL_0$ and $BL_2$ are not transmitting the corresponding level, the level on the bit lines $BL_1$ and $BL_3$ are not affected by the level on the neighboring bit lines (i.e. the bit lines $BL_0$ and $BL_2$).

The arrangement of the cells are interlaced, thus, the bit lines have a resistance function for noise generated by the coupling capacitances. Additionally, the memory does not require extra pull-up loads such that power consumption is not increased. Thus, the memory 210 requires less power consumption when compared to like, prior art memories.

In other embodiments, a row controller (not shown) is utilized to assert or un-assert the word lines $WL_0 \sim WL_m$. When one word line is asserted, the other word lines are un-asserted. Since those skilled in the art can utilize numerous methods to achieve the row controller, description thereof is omitted.

In this embodiment, the word line, which corresponds to the cell corresponding to one bit line, is the same as the word line, which corresponds to the cell corresponding to another bit line. The two bit lines are not neighboring. Taking the bit lines $BL_0 \sim BL_3$ as an example, the bit lines $BL_0 \sim BL_3$ are sequentially disposed in parallel. The bit lines $BL_0$ is not neighboring on the bit line $BL_2$. Similarly, the bit lines $BL_1$ is not neighboring on the bit line $BL_3$.

The word line (e.g. $WL_0$), which corresponds to the cell (e.g. $C_{00}$) corresponding to the bit line $BL_0$, is the same as the word line (e.g. $WL_0$), which corresponds to the cell (e.g. $C_{02}$) corresponding to the bit line $BL_2$. The word line (e.g. $WL_2$), which corresponds to the cell (e.g. $C_{20}$) corresponding to the bit line $BL_0$, is the same as the word line (e.g. $WL_2$), which corresponds to the cell (e.g. $C_{22}$) corresponding to the bit line $BL_2$. Similarly, the word line (e.g. $WL_1$), which corresponds to the cell (e.g. $C_{11}$) corresponding to the bit line $BL_1$, is the same as the word line (e.g. $WL_1$), which corresponds to the cell (e.g. $C_{13}$) corresponding to the bit line $BL_3$. The word line (e.g. $WL_3$), which corresponds to the cell (e.g. $C_{31}$) corresponding to the bit line $BL_1$, is the same as the word line (e.g. $WL_3$), which corresponds to the cell (e.g. $C_{33}$) corresponding to the bit line $BL_3$.

In this embodiment, the cells of the memory 210 comprise transistors. Taking the cell $C_{00}$ as an example, the cell $C_{00}$ comprises transistor $T_{00}$. The transistor $T_{00}$ comprises a control terminal coupled to the corresponding word line (e.g. $WL_0$), a first electrode receiving a low level (e.g. grounding level $V_{SS}$), and a second electrode.

Since the second electrode of the transistor $T_{00}$ electrically connects to the bit line $BL_0$, the cell $C_{00}$ stores 0. Similarly, since the second electrode of the transistor $T_{11}$ does not electrically connect to the bit line $BL_1$, the cell $C_{11}$ stores 1. In this embodiment, all transistors are N type transistors. Thus, each N type transistor comprises a gate serving as the control terminal, a source serving as the first electrode, and a drain serving as the second electrode. In other embodiments, the N type transistors are replaced by P type transistors.

Due to the interlaced arrangement of the cells, the neighboring bit lines are not affected by the noise generated by the coupling capacitance. Furthermore, the memory does not require extra pull-up loads. Thus, costs and the power consumption are reduced when compared to like, prior art memories.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A storage device, comprising:
    a memory comprising:
    a plurality of word lines sequentially disposed in parallel;
    a first bit line, a second bit line, and a third bit line sequentially disposed in parallel and vertical with the word lines; and
    a plurality of cells, each corresponding to one word line and one bit line, wherein the word line, which corresponds to the cell corresponding to the first bit line, differs from the word line, which corresponds to the cell corresponding to the second bit line; and
    a read circuit coupled to the memory for reading the data stored in the memory,
    wherein each cell comprises a transistor, and
    wherein a first cell among the cells corresponds to the first bit line and comprises a first transistor, which comprises a control terminal coupled to a corresponding word line, a first electrode receiving a grounding level, and a second electrode wherein when the second electrode is electrically un-connected to the first bit line, it indicates that the first cell stores 1.

2. The storage device as claimed in claim 1, wherein the word line, which corresponds to the cell corresponding to the first bit line, is the same as the word line, which corresponds to the cell corresponding to the third bit line.

3. The storage device as claimed in claim 1, wherein when the second electrode is electrically connected to the first bit line, it indicates that the first cell stores 0.

4. The storage device as claimed in claim 1, wherein the first transistor is an N type transistor, which comprises a gate serving as the control terminal, a source serving as the first electrode, and a drain serving as the second electrode.

5. The storage device as claimed in claim 1, wherein the reading circuit comprises:
    a sensing unit determining the data stored in the cells; and
    a switching unit coupled between the bit lines and the sensing unit for selectively outputting the data stored in the cells.

6. The storage device as claimed in claim 5, wherein the sensing unit comprises a comparator, which comprises a non-inverting input, an inverting input receiving a reference signal, and an output terminal.

7. The storage device as claimed in claim 6, wherein the switching unit at least comprises:
- a first switch coupled between the non-inverting input and the first bit line; and
- a second switch coupled between the non-inverting input and the second bit line.

8. A memory, comprising:
- a plurality of word lines sequentially disposed in parallel;
- a first bit line, a second bit line, and a third bit line sequentially disposed in parallel and vertical with the word lines; and
- a plurality of cells, each corresponding to one word line and one bit line, wherein the word line, which corresponds to the cell corresponding to the first bit line, differs from the word line, which corresponds to the cell corresponding to the second bit line,
- wherein each cell comprises a transistor, and
- wherein a first cell among the cells corresponds to the first bit line and comprises a first transistor, which comprises a control terminal coupled to a corresponding word line, a first electrode receiving a grounding level, and a second electrode wherein when the second electrode is electrically un-connected to the first bit line, it indicates that the first cell stores 1.

9. The memory as claimed in claim 8, wherein the word line, which corresponds to the cell corresponding to the first bit line, is the same as the word line, which corresponds to the cell corresponding to the third bit line.

10. The memory as claimed in claim 8, wherein when the second electrode is electrically connected to the first bit line, it indicates that the first cell stores 0.

11. The memory as claimed in claim 8, wherein the first transistor is an N type transistor, which comprises a gate serving as the control terminal, a source serving as the first electrode, and a drain serving as the second electrode.

* * * * *